United States Patent
Lee

(10) Patent No.: US 10,205,076 B2
(45) Date of Patent: Feb. 12, 2019

(54) LIGHT EMITTING DEVICE

(71) Applicant: Seoul Semiconductor Co., Ltd., Ansan-si (KR)

(72) Inventor: Tae Chang Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/978,486

(22) Filed: May 14, 2018

(65) Prior Publication Data

US 2018/0261744 A1 Sep. 13, 2018

Related U.S. Application Data

(63) Continuation of application No. 15/306,386, filed as application No. PCT/KR2015/003936 on Apr. 20, 2015, now Pat. No. 9,978,919.

(30) Foreign Application Priority Data

Apr. 22, 2014 (KR) .................. 10-2014-0048174

(51) Int. Cl.
*H01L 33/62* (2010.01)
*H01L 33/48* (2010.01)
*H01L 33/60* (2010.01)

(52) U.S. Cl.
CPC ............ *H01L 33/62* (2013.01); *H01L 33/483* (2013.01); *H01L 33/60* (2013.01); *H01L 2224/48091* (2013.01); *H01L 2224/48247* (2013.01)

(58) Field of Classification Search
CPC ......... H01L 23/49541; H01L 23/49537; H01L 23/49548; H01L 23/49551;
(Continued)

(56) References Cited

U.S. PATENT DOCUMENTS 8,093,619 B2  1/2012 Hayashi
2008/0105888 A1  5/2008 Wang et al.
(Continued)

FOREIGN PATENT DOCUMENTS

CN  103367619  10/2013
JP  2001-057443  2/2001
(Continued)

OTHER PUBLICATIONS

Notice of Allowance dated Jan. 22, 2018, in U.S. Appl. No. 15/306,386.
(Continued)

*Primary Examiner* — Thanh Y Tran
(74) *Attorney, Agent, or Firm* — H.C. Park & Associates, PLC

(57) ABSTRACT

Disclosed is a light emitting device. The light emitting device comprises: a first lead and a second lead which are spaced apart from each other; a body part comprising a base, a reflector, and a cavity; and a light emitting diode which is disposed in the cavity, wherein the first lead includes a first bottom lead and a first top lead located on the first bottom lead, and the second lead includes a second bottom lead and a second top lead located on the second bottom lead, and wherein a separation region between the first top lead and the second top lead has a different shape than the separation region between the first bottom lead and the second bottom lead, the separation region between the first top lead and the second top lead having a shape bent at least once.

20 Claims, 6 Drawing Sheets

(58) Field of Classification Search
CPC ... H01L 23/49555; H01L 33/62; H01L 33/60; H01L 33/54; H01L 33/483; H01L 2224/48091; H01L 2224/48247; H01L 2224/48248

See application file for complete search history.

(56) References Cited

U.S. PATENT DOCUMENTS

| | | |
|---|---|---|
| 2010/0270571 A1 | 10/2010 | Seo |
| 2010/0314654 A1 | 12/2010 | Hayashi |
| 2013/0256733 A1* | 10/2013 | Lin .................. H01L 33/62 257/99 |
| 2013/0343067 A1 | 12/2013 | Okada |
| 2014/0264426 A1* | 9/2014 | Yamashita ........... H01L 23/495 257/99 |
| 2015/0021640 A1 | 1/2015 | Oka et al. |
| 2016/0111611 A1 | 4/2016 | Yoshida et al. |

FOREIGN PATENT DOCUMENTS

| | | |
|---|---|---|
| JP | 2008-118107 | 5/2008 |
| KR | 10-2009-0057755 | 6/2009 |
| KR | 10-2010-0132756 | 12/2010 |
| KR | 10-2013-0083883 | 7/2013 |

OTHER PUBLICATIONS

Final Office Action dated Aug. 24, 2017, in U.S. Appl. No. 15/306,386.
Non-Final Office Action dated Mar. 10, 2017, in U.S. Appl. No. 15/306,386.
Office Action dated Apr. 2, 2018, in Chinese Patent Application No. 201580032393.7.
European Search Report dated Aug. 21, 2017, in European Patent Application No. 15782991.2.
Written Opinion dated Jul. 23, 2016, in International Application No. PCT/KR2015/003936.
International Search Report dated Jul. 23, 2016, in International Application No. PCT/KR2015/003936.

* cited by examiner

LIGHT EMITTING DEVICE

CROSS REFERENCE TO RELATED APPLICATION

This application is a Continuation of U.S. patent application Ser. No. 15/306,386, filed Oct. 24, 2016, which is the National Stage Entry of International Application No. PCT/KR2015/003936, filed Apr. 20, 2015, and claims priority from Korean Patent Application No. 10-2014-0048174, filed Apr. 22, 2014, each of which is incorporated herein by reference for all purposes as if fully set forth herein.

BACKGROUND

Field

Exemplary embodiments of the present disclosure relate to a light emitting device and, more particularly, to a light emitting device with improved strength.

A light emitting diode refers to an inorganic semiconductor device configured to emit light through recombination of electrons and holes and has been used in various fields including displays, car lamps, general lighting, and the like. With many advantages of the light emitting diode such as long lifespan, low power consumption and rapid response, a light emitting device such as a light emitting diode package including such a light emitting diode is expected to replace typical light sources.

A light emitting device including a light emitting diode may be manufactured in various forms according to purposes thereof and the structure of the light emitting device is determined by taking luminous efficacy and durability into account. FIG. 1A and FIG. 1B show one example of a typical light emitting device including a light emitting diode.

Referring to FIG. 1A and FIG. 1B, a typical light emitting device includes: a body 20 including a base 21, a reflector 23 and a cavity 25 surrounded by the reflector 23; a first lead 11 and a second lead 13 secured to the body 20 and partially exposed to the cavity 25 and a lower surface of the body 20; and a light emitting diode 30 disposed on an upper surface of at least one of the leads 11, 13 and electrically connected to the leads 11, 13. In the light emitting device, the first lead 11 and the second lead 13 are separated from each other and a space (region around line C-C') between both leads 11, 13 is occupied by the base 21.

Generally, the cavity 25 occupies a large area in the overall area of the base 21 in order to improve luminous efficacy of the light emitting device. That is, as shown in FIG. 1A, the lateral thickness of the reflector 23 is reduced to increase the area of the cavity 25, thereby improving luminous efficacy of the light emitting device. Furthermore, in consideration of the structural characteristics of a wire and heat dissipation efficiency, the leads 11, 13 are generally formed to have a large area.

When the light emitting device with the structure as described above is subjected to external impact or stress, the base 21 in the space (region around line C-C') between the first lead 11 and the second lead 13 is damaged. Particularly, when the base 21 in the region between the first lead 11 and the second lead 13 is damaged, the wire 31 is likely to be disconnected, thereby causing failure of the light emitting device. However, in consideration of luminous efficacy and heat dissipation efficiency is limited due to a decrease of the area of the cavity 25 or an increase in separation distance between the leads 11, 13. Therefore, there is a need for a light emitting device to have high reliability while maintaining the same level of luminous intensity as a typical light emitting device in the art.

SUMMARY

Exemplary embodiments of the present disclosure provide a light emitting device that exhibits high strength with respect to external impact or stress.

Exemplary embodiments of the present disclosure provide a light emitting device that has high strength while maintaining the same level of luminous intensity as a typical light emitting device in the art.

In accordance with one aspect of the present disclosure, a light emitting device includes: a first lead and a second lead separated from each other; a body including a base at least partially surrounding side surfaces of the first and second leads and filling a separation region between the first and second leads, a reflector disposed on the base, and a cavity surrounded by the reflector and open at an upper side thereof; and a light emitting diode disposed in the cavity, wherein the first lead includes a first bottom lead and a first top lead disposed on the first bottom lead, the second lead includes a second bottom lead and a second top lead disposed on the second bottom lead, a separation region between the first top lead and the second top lead has a different shape than the separation region between the first bottom lead and the second bottom lead, and the separation region between the first top lead and the second top lead has a shape bent at least once.

In the light emitting device, the base disposed in the separation region between the leads has improved strength, thereby improving reliability of the light emitting device.

In addition, the first top lead may include a first protrusion and a first indentation formed on a side surface thereof facing the second top lead, and the second top lead may include a second protrusion and a second indentation formed on a side surface thereof facing the first top lead.

Further, the first protrusion may be disposed in a region of the first top lead corresponding to the second indentation and the second protrusion may be disposed in a region of the second top lead corresponding to the first indentation.

The first protrusion may be formed corresponding to the second indentation to engage therewith and the second protrusion may be formed corresponding to the first indentation to engage therewith.

In other exemplary embodiments, the first protrusion and the first indentation may be placed at opposite ends of the side surface of the first top lead facing the second top lead, respectively, and the second protrusion and the second indentation may be placed at opposite ends of the side surface of the second top lead facing the first top lead, respectively.

A region of the side surface interposed between the first protrusion and the first indentation may have a linear shape.

The separation region between the first protrusion and the second indentation and the separation region between the second protrusion and the first indentation may be placed under the reflector.

In some exemplary embodiments, the first bottom lead and the second bottom lead may include a first chamfered portion and a second chamfered portion formed at corners of the side surfaces of the first bottom lead and the second bottom lead facing each other, respectively.

The first bottom lead or the second bottom lead may not be disposed in a region under the first protrusion and in a region under the second protrusion.

In other exemplary embodiments, at least one of the first bottom lead and the second bottom lead may include a chamfered portion formed at a corner of each of the side surfaces of the first bottom lead and the second bottom lead facing each other.

A ratio (R/W2) of degree of chamfer R of the chamfered portion to width W2 of one side surface of the light emitting device may be greater than 0.052 to 0.25.

The first bottom lead and the second bottom lead may be disposed in regions of the first top lead and the second top lead, respectively.

A ratio (W1/W2) of width W1 of the cavity corresponding to a cross-section parallel to one side surface of the light emitting device to width W2 of the one side surface of the light emitting device may be 0.8 to less than 0.92.

The light emitting device may further include a light emitting diode disposed in the cavity.

In accordance with another aspect of the present disclosure, a lead includes a first lead and a second lead separated from each other, wherein the first lead includes a first bottom lead and a first top lead disposed on the first bottom lead, the second lead includes a second bottom lead and a second top lead disposed on the second bottom lead, a separation region between the first top lead and the second top lead has a different shape than the separation region between the first bottom lead and the second bottom lead, and the separation region between the first top lead and the second top lead has a shape bent at least once.

The first top lead may include a first protrusion and a first indentation formed on a side surface thereof facing the second top lead, and the second top lead may include a second protrusion and a second indentation formed on a side surface thereof facing the first top lead.

The first protrusion may be disposed in a region of the first top lead corresponding to the second indentation and the second protrusion may be disposed in a region of the second top lead corresponding to the first indentation.

The first protrusion may be formed corresponding to the second indentation to engage therewith and the second protrusion may be formed corresponding to the first indentation to engage therewith.

The first protrusion and the first indentation may be placed at opposite ends of the side surface of the first top lead facing the second top lead, respectively, and the second protrusion and the second indentation may be placed at opposite ends of the side surface of the second top lead facing the first top lead, respectively.

A region of the side surface interposed between the first protrusion and the first indentation may have a linear shape.

The first bottom lead and the second bottom lead may include a first chamfered portion and a second chamfered portion formed at corners of the side surfaces of the first bottom lead and the second bottom lead facing each other, respectively.

The first bottom lead or the second bottom lead may not be disposed in a region under the first protrusion and in a region under the second protrusion.

At least one of the first bottom lead and the second bottom lead may include a chamfered portion formed at a corner of each of the side surfaces of the first bottom lead and the second bottom lead facing each other.

According to exemplary embodiments, the light emitting device includes protrusions, indentations and/or chamfered portions formed on a side surface facing leads, whereby a region between the leads can have improved strength. As a result, the light emitting device according to the exemplary embodiments has improved reliability.

In addition, the light emitting device includes a reflector, a lateral thickness of which is thickened without deterioration in luminous intensity, thereby providing improved strength while securing the same level of luminous intensity as a typical light emitting device.

DETAILED DESCRIPTION OF THE ILLUSTRATED EMBODIMENTS

Figure 1A:
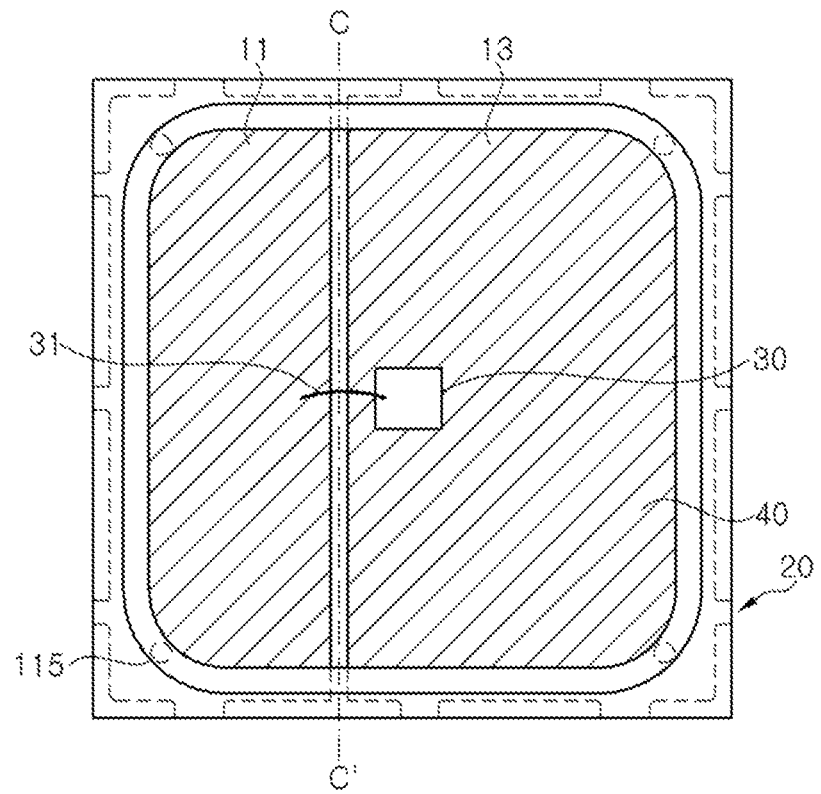
FIG. 1A is a top view of a typical light emitting device.
Figure 1B:
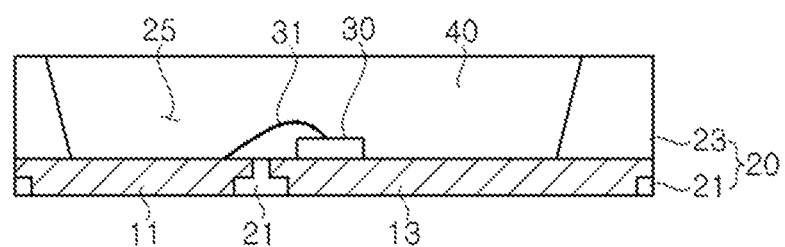
FIG. 1B is a side sectional view of a typical light emitting device.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

EXEMPLARY EMBODIMENTS

Figure 2:
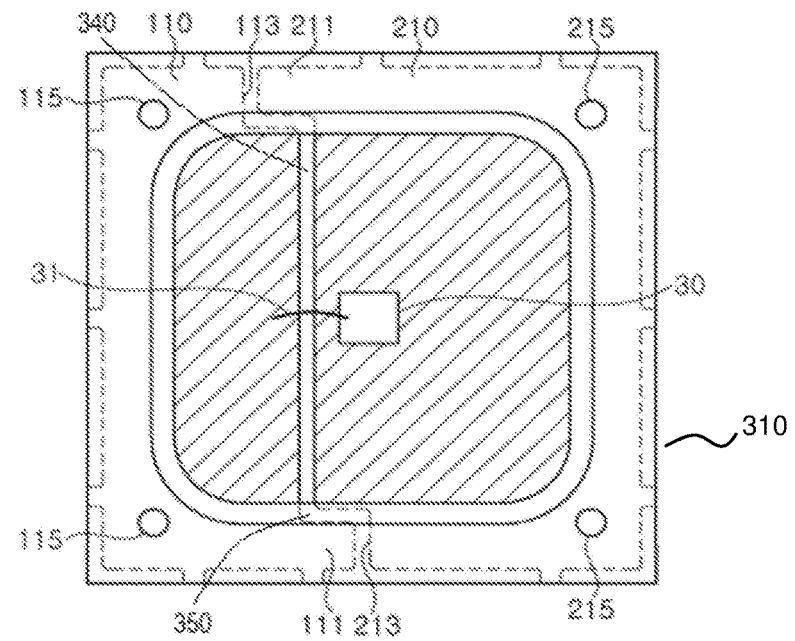
FIG. 2 is a light emitting device according to an exemplary embodiment of the present disclosure.
Figure 3:
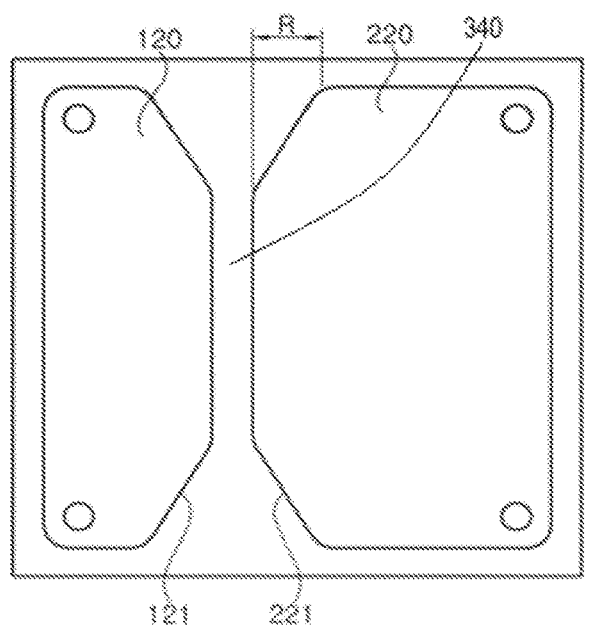
FIG. 3 is a bottom view of the light emitting device of FIG. 2.
Figure 4:
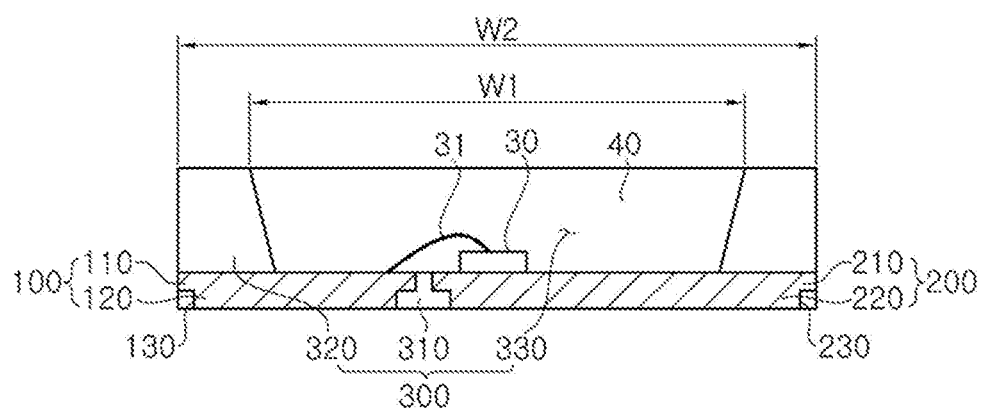
FIG. 4 is a side sectional view of the light emitting device of FIG. 1.
Figure 5A:
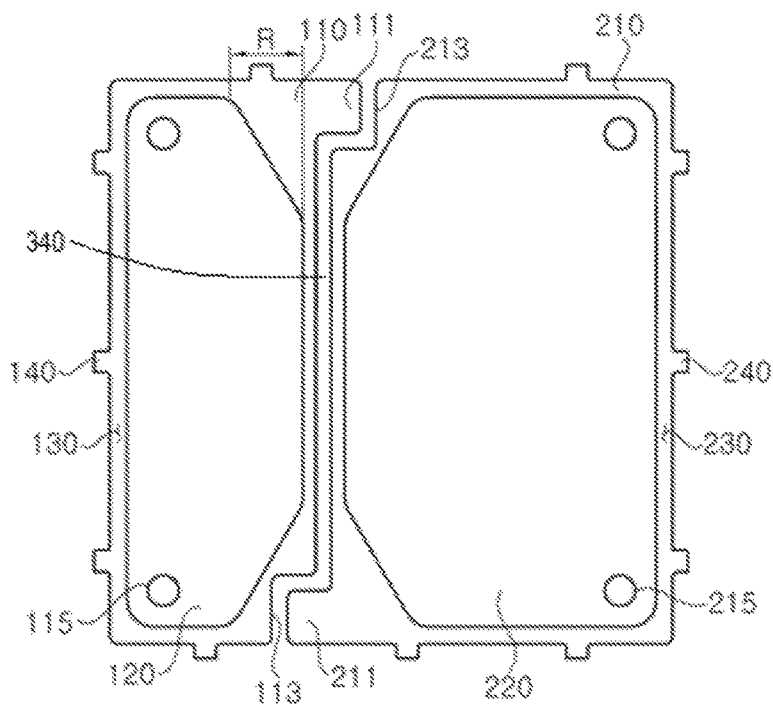
FIG. 5A is a bottom view of leads according to an exemplary embodiment of the present disclosure.
Figure 5B:
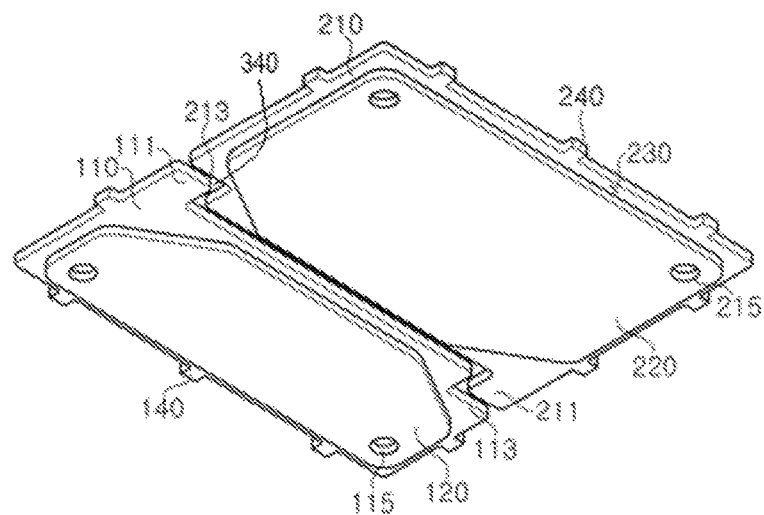
FIG. 5B is a bottom perspective view of the leads of FIG. 5A.

FIG. 2, FIG. 3, and FIG. 4 are a top view, a bottom view, and a side sectional view of a light emitting device according to an exemplary embodiment of the present disclosure, respectively. In addition, FIG. 5A and FIG. 5B are a bottom view and a bottom perspective view of leads according to one exemplary embodiment of the present disclosure, respectively.

Referring to FIG. 2, FIG. 3, and FIG. 4, the light emitting device according to the exemplary embodiment includes a first lead 100, a second lead 200, a body 300, and a light emitting diode 30. The light emitting device may further include a wire 31 and a molding portion 40.

The first lead 100 and the second lead 200 may be separated from each other and disposed at a lower portion of the light emitting device to form part of a lower region of the light emitting device. Particularly, a separation region 340 between the first lead 100 and the second lead 200 may be filled with a base 310, and a lower surface of the base 310 may be flush with lower surfaces of the first and second leads 100, 200 to provide a flat lower surface of the light emitting device.

The first lead 100 may include a first top lead 110 and a first bottom lead 120, and the second lead 200 may include a second top lead 210 and a second bottom lead 220. The first top and bottom leads 110, 120 may be integrally formed with each other, and the second top and bottom leads 210, 220 may also be integrally formed with each other. The first lead 100 and the second lead 200 may include a material exhibiting high electric and thermal conductivity, for example, a metal or a metal alloy.

A portion of the separation region 340 that is positioned between the first top lead 110 and the second top lead 210 may have a different shape than another portion of the separation region 340 that is positioned between the first bottom lead 120 and the second bottom lead 220. The separation region 340 that is positioned between the first top lead 110 and the second top lead 210 has a shape bent at least once. Referring to FIG. 2, the separation region 340 that is positioned between the first top lead 110 and the second top lead 210 bent at the bent region 350.

Next, referring to FIG. 2, FIG. 3, FIG. 4, FIG. 5A, and FIG. 5B, the first and second leads 100, 200 according to the exemplary embodiment will be described in more detail.

First, the first lead 100 includes the first top lead 110 and the first bottom lead 120. The first top lead 110 may be disposed on the first bottom lead 120, have a larger area than the first bottom lead 120, and be placed in a region occupied by the first top lead 110. Accordingly, only the first top lead 110 is exposed on an upper surface of the first lead 100 in a top view of the first lead 100. Further, an edge 130 may be formed on a side surface of the first lead 100 due to a difference in area between the first top and bottom leads 110, 120, as shown in FIG. 4. Such an edge 130 is filled with the base 310, whereby the first lead 100 and the body 300 can be more firmly secured to each other.

The second lead 200 also includes the second top lead 210 and the second bottom lead 220. The second top lead 210 may be disposed on the second bottom lead 220, have a larger area than the second bottom lead 220, and be placed in a region occupied by the second top lead 210. Accordingly, only the second top lead 210 is exposed on an upper surface of the second lead 200 in a top view of the second lead 200. Further, an edge 230 may be formed on a side surface of the first lead 200 due to a difference in area between the second top and bottom leads 210, 220, as shown in FIG. 4. Such an edge 230 is filled with the base 310, whereby the second lead 200 and the body 300 can be more firmly secured to each other.

The first top lead 110 may include a first protrusion 111 formed on a side surface thereof facing the second top lead 210 to protrude toward the second top lead 210 and a first indentation 113 formed thereon to be depressed in an opposite direction to the second top lead 210. The second top lead 210 may also include a second protrusion 211 and a second indentation 213 formed on a side surface thereof facing the first top lead 110.

The second indentation 213 may be placed in a region of the second top lead 210 corresponding to the first protrusion 111 and the first indentation 113 may be placed in a region of the first top lead 110 corresponding to the second protrusion 211. Namely, as shown in FIG. 2, FIG. 5A, and FIG. 5B, the first protrusion 111 and the second indentation 213 may be disposed in the corresponding regions so as to engage with each other, and the second protrusion 211 and the first indentation 113 may also be disposed in the corresponding regions so as to engage with each other.

The first protrusion 111 and the first indentation 113 may be placed at opposite ends of the side surface of the first lead 100 facing the second lead 200. In addition, the second protrusion 211 and the second indentation 213 may be placed at opposite ends of the side surface of the second lead 200 facing the first lead 100. In this structure, the side surface of the first lead 100 in a region between the first protrusion 111 and the first indentation 113 and the side surface of the second lead 200 in a region between the second protrusion 211 and the second indentation 213 may have a linear shape and be parallel to each other. However, it should be understood that other implementations are also possible and a separation region 340 between the first lead 100 and the second lead 200 may have various shapes. That is, in other exemplary embodiments, the separation region 340 between the first top lead 110 and the second top lead 210 may have other shapes instead of the linear shape.

The light emitting device according to an exemplary embodiment includes the leads each having the protrusion and the indentation formed thereon such that the protrusions engage with the corresponding indentations. Accordingly, even in the case where cracks are generated at a distal end of the separation region between the first lead 100 and the second lead 200, propagation of the cracks can be blocked due to the presence of a bent portion 350 in the separation region between the leads. That is, the protrusions and the indentations formed to engage with each other and placed at the opposite ends of the side surfaces of the leads facing each other can efficiently prevent generation and propagation of cracks. With this structure, the light emitting device has improved strength and can secure good reliability. Particularly, since the indentations and the protrusions are formed on the side surfaces of the leads facing each other in order to improve strength of the light emitting device, the strength of the light emitting device can be improved without increasing the separation distance between the leads or modifying other components of the light emitting device.

Each of the first top lead 110 and the second top lead 120 may include fine protrusions 140 or 240 formed on other side surfaces thereof excluding the sides surfaces thereof facing each other. A space between the fine protrusions 140 or 240 may be filled with the base 310 (described more below). With the structure wherein the fine protrusions 140, 240 are further formed on the first top lead 110 and the second top lead 120, the light emitting device can effectively prevent the leads 100, 200 from being detached or separated from the base 310.

The first bottom lead 120 and the second bottom lead 220 are disposed under the first top lead 110 and the second top lead 210, respectively.

The first bottom lead 120 may include a first chamfered portion 121 formed on the side surface thereof facing the second bottom lead 220. The second bottom lead 220 may also include a second chamfered portion 221 formed on the side surface thereof facing the first bottom lead 120.

As shown in the drawings, each of the first chamfered portion 121 and the second chamfered portion 221 may be formed at opposite ends of each of the side surfaces of the first bottom lead 120 and the second bottom lead 220 facing each other. With this structure, a separation distance between the first bottom lead 120 and the second bottom lead 220 may gradually increase from a central region of each of the side surfaces thereof facing each other to a corner thereof.

Since the corners of the lower first and second leads 120, 220 are replaced by the first chamfered portion 121 and the second chamfered portion 221, respectively, the lower first and second leads 120, 220 may not be placed under the first protrusion 111 and the second protrusion 211, respectively. Accordingly, a portion of the base 310 placed at the opposite ends of the separation region 340 between the leads 100, 120 can have further improved strength.

The degree of chamfer of each of the first and second chamfered portions 121, 221 may be adjusted in various ways and determined by taking into account the strength of the light emitting device and heat dissipation efficiency provided by the leads. Herein, as shown in FIG. 3, a distance from a chamfering start point on each of the side surfaces facing each other to a vertex point at a bent portion formed by chamfering is defined as the degree of chamfer R. Here, the degree of chamfer R may be adjusted in various ways depending upon the size of the light emitting device. For example, when the width of one side surface of the light emitting device parallel to a virtual line indicating the degree of chamfer R is defined as W2, a ratio (R/W2) of the degree of chamfer R to the width W2 may be greater than 0.052 to 0.25. For example, for a light emitting device, one side surface of which has a width W2 of 5 mm, the degree of chamfer R may be greater than 0.26 mm to 1.25 mm.

Such a degree of chamfer R may be applied to both the first bottom lead 120 and the second bottom lead 220. In addition, the chamfered portions having the same degree of chamfer R or the different degrees of chamber R may be formed on all of corners of the side surfaces of the leads facing each other.

One mechanism of damage to the separation region 340 between the leads is generation of cracks at the opposite ends of the separation region 340 between the leads and propagation of the cracks along the separation region 340 therebetween. However, according to the exemplary embodiment, the chamfered portions are formed on the side surfaces of the lower leads facing each other, thereby effectively preventing generation of cracks in the base 310 at the opposite ends of the separation region 340 between the leads. With this structure, the light emitting device can have improved strength.

Referring to FIG. 2, FIG. 3, FIG. 4, FIG. 5A, and FIG. 5B again, at least one of the first lead 100 and the second lead 200 may include at least one through-hole 115, 215 vertically formed therethrough. The through-holes 115, 215 may be filled with the base 310, whereby the base 310 can be more firmly secured to the leads 100, 200.

The through-holes 115, 215 may have an inclined side surface and an end portion. With this structure, an upper opening of each of the through-holes 115, 215 may have a different area than a lower opening thereof.

Referring to FIG. 2, FIG. 3, and FIG. 4 again, the body 300 may include the base 310, a reflector 320, and a cavity 330.

The base 310 surrounds at least part of the side surfaces of the first and second leads 100, 200, and particularly, fills the separation region 340 between the first lead 100 and the second lead 200. Upper and lower surfaces of the first lead 100 and the second lead 200 may be exposed, whereby an upper surface of the base 310 may be generally coplanar and flush with the upper surfaces of the leads 100, 200 and a lower surface of the base 310 may be generally coplanar and flush with the lower surfaces of the leads 100, 200. However, it should be understood that other implementations are also possible. On the other hand, the fine protrusions 140, 240 may be exposed through side surfaces of the base 310. The base 310 can act as a substrate of the light emitting device together with the leads 100, 200.

The base 310 may include a ceramic or polymer material, for example, a silicone, polyamide, or epoxy resin. Furthermore, the base 310 may further include fillers such as $TiO_2$.

The reflector 320 may be disposed along an outer periphery of a lower region of the light emitting device, which is composed of the base 310 and the leads 100, 200, whereby the cavity 300 may be formed in a region surrounded by the reflector 320. The first and second leads 100, 200 and the base 310 may be partially exposed to a lower surface of the cavity 300.

The reflector 320 may serve to reflect light emitted from the light emitting diode 30 towards an upper portion of the light emitting device and may have an inclined inner side surface in order to secure more efficient reflection.

A lateral thickness of the reflector 320 may be determined in consideration of strength and luminous intensity of the light emitting device, as needed. With a structure wherein the reflector 320 has a large lateral thickness, luminous intensity of the light emitting device can be deteriorated due to a decrease in the area of the cavity 300 from an increase in the thickness of the reflector, despite improved strength of the light emitting device.

In order to maintaining luminous intensity of the light emitting device while improving strength of the light emitting device, the lateral thickness of the reflector 320 may be determined as follows. Referring to FIG. 4, in a cross-section taken along a virtual line penetrating the center of the light emitting device and parallel to one side surface thereof, the overall width of the cross-section is defined as W2 and the width of an upper portion of the cavity 330 is defined as W1. Here, W1/W2 may be 0.8 to less than 0.92. For example, in a light emitting device having a width W2 of 5 mm, the cavity 330 may have a width W1 of 4.0 mm to less than 4.6 mm. With this structure, the light emitting device can have improved strength while maintaining luminous intensity, thereby improving reliability.

The reflector 320 can cover the protrusions 111, 211 and the indentation 113, 213 of the first and second leads 100, 200. Accordingly, a portion having a linear shape in the separation region 340 between the first top lead 110 and the second top lead 210 can be exposed to the lower surface of the cavity 330. This structure can more effectively prevent generation of cracks at the opposite ends of the separation region 340 between the first lead 100 and the second lead 200. However, it should be understood that other implementations are possible.

The reflector 320 may include a ceramic or polymer material, for example, a silicone, polyamide, or epoxy resin. Furthermore, the reflector 320 may further include fillers such as $TiO_2$.

The reflector 320 and the base 310 may be integrally formed with each other. Alternatively, the reflector 320 and the base 310 may be formed as separate components. When the reflector 320 and the base 310 are integrally formed with each other, the reflector 320 and the base 310 may be formed at the same time through molding once.

The light emitting diode 30 may be placed on at least one of the first lead 100 and the second lead 200. The light emitting diode 30 may be selected from various light emitting diodes known to those skilled in the art. The light emitting diode 30 may be a lateral, vertical, or flip-chip type light emitting diode and electrical connection of the light emitting diode may be determined depending upon the shape thereof. For example, as shown in the drawings, the light emitting diode 30 may be a vertical type light emitting diode and may be disposed on the second lead 200 to be electrically connected to the second lead 200 through the lower surface thereof and to be electrically connected to the first lead 100 through the wire 31.

Furthermore, although the light emitting device is illustrated as including one light emitting diode 30 in this exemplary embodiment, it should be understood that other implementations are possible and the light emitting device may include a plurality of light emitting diodes 30.

Description of details of the light emitting diode 30 known in the art will be omitted.

The light emitting device may further include the molding portion 40, which fills the cavity 300 and encapsulates the light emitting diode 30. The molding portion 40 may have light transmittance and may include, for example, a silicone or polymer material.

EXPERIMENTAL EXAMPLES

Figure 6:
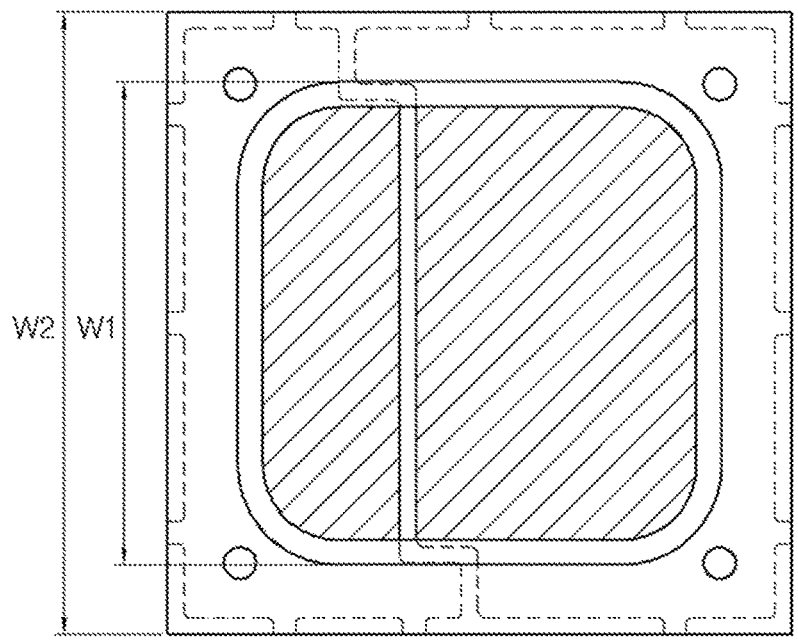
FIG. 6, FIG. 7 and FIG. 8 are plan views illustrating experimental examples for evaluating strength improvement of light emitting devices according to exemplary embodiments of the present disclosure.
Figure 7:
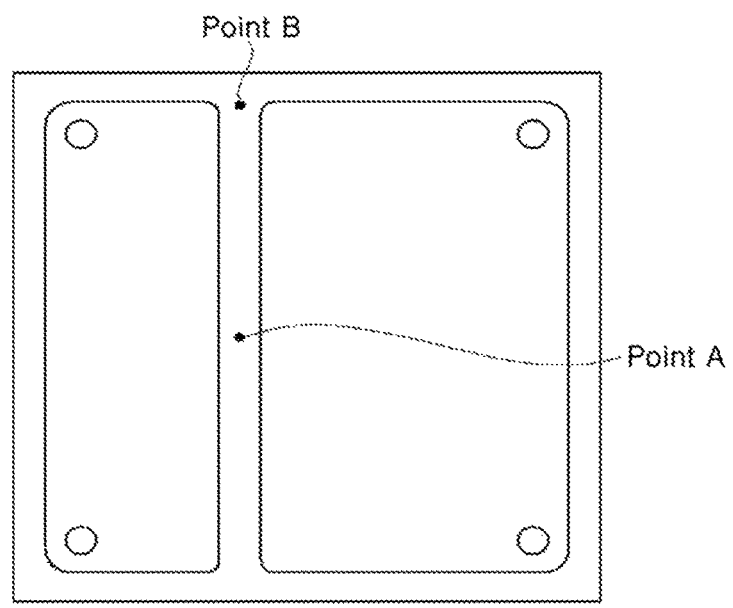
Figure 8:
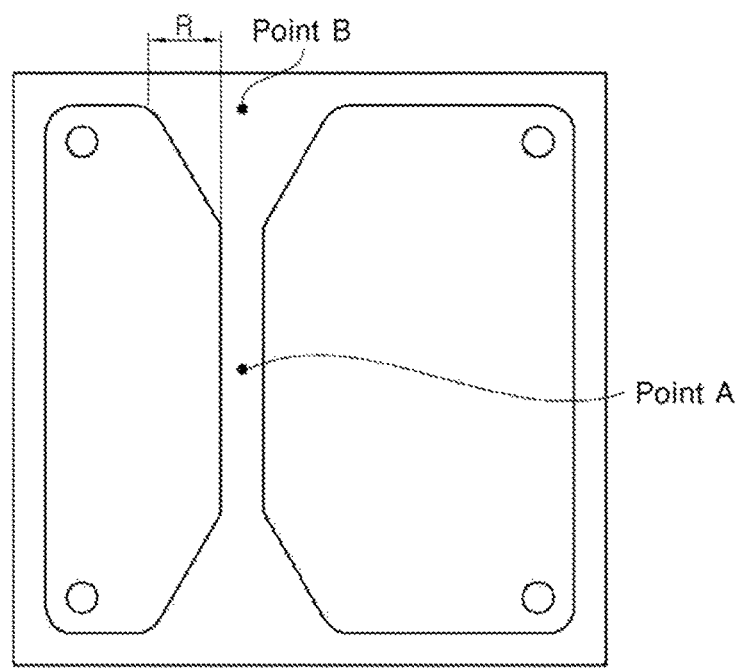

FIG. 6, FIG. 7, and FIG. 8 are plan views illustrating experimental examples for evaluating strength improvement of light emitting devices according to exemplary embodiments of the present disclosure. These experimental examples are provided for illustration of improvement in strength and deterioration in luminous intensity of light emitting devices according to exemplary embodiments of the present disclosure. The light emitting devices used in the experimental examples had a size of 5×5 mm². In addition, the light emitting diode of each of the light emitting devices was manufactured by Seoul Viosys Co., Ltd. and had a size of 650×1300 μm².

First Experimental Example

In a first experimental example, influence of the lateral thickness of the reflector on luminous intensity of the light emitting device was evaluated. Referring to FIG. 6, Samples 1, 2, and 3 had a W2 of 5 mm and a W1 of 4.6 mm, 4.2 mm, or 4.0 mm. Table 1 shows luminous intensity of the light emitting diode, luminous flux of the light emitting device, and a k-factor indicating a ratio of luminous intensity of the light emitting diode to luminous flux of the light emitting device. The k-factor can be calculated as follows.

$$k-\text{factor} = \frac{\text{Luminous flux of light emitting device}}{(\text{Luminous intensity of light emitting diode}) \times 1000}$$

TABLE 1

|  | Luminous flux of light emitting device (lm) | Luminous intensity of light emitting diode (mW) | k-factor |
|---|---|---|---|
| Sample 1 (W1 = 4.6 mm) | 164.67 | 0.459 | 0.358 |
| Sample 2 (W1 = 4.2 mm) | 165.65 | 0.464 | 0.357 |
| Sample 3 (W1 = 4.0 mm) | 164.48 | 0.460 | 0.357 |

According to this experimental example, it can be seen that, even in the case where the width of the cavity was decreased from 4.6 mm to 4.0 mm by increasing the lateral thickness of the reflector, the k-factor was remained at substantially the same level. That is, it can be seen that, even in the case where the width of the cavity was decreased to 0.8 times that of one side surface of the light emitting device in order to increase strength of the light emitting device, luminous intensity of the light emitting device was generally maintained.

Second Experimental Example

In a second experimental example, strength of the light emitting device depending upon the presence of protrusions and indentations on the first lead and the second lead was measured. Strength of the light emitting device was measured using a push-pull gauge system. As shown in FIG. 7, load was applied to points A and B. Table 2 shows measurement results of strength depending upon the width of the cavity and the presence of the protrusions and the indentations.

TABLE 2

|  | W1 = 4.6 | | W1 = 4.2 | | W1 = 4.0 | |
|---|---|---|---|---|---|---|
|  | Point A | Point B | Point A | Point B | Point A | Point B |
| Absence of protrusion and indentation (kg) | 0.977 | 0.584 | 1.369 | 0.848 | 1.742 | 1.038 |
| Presence of protrusion and indentation (kg) | 1.043 | 0.616 | 1.465 | 0.898 | 1.868 | 1.100 |
| Strength increase ratio (%) | 106.8% | 105.5% | 107.0% | 105.9% | 107.2% | 106.0% |

According to the second experimental example, it can be seen that the protrusions and indentations on the leads increased strength both in a central portion and an outer peripheral portion of the separation region between the leads. Further, it can be seen that the light emitting device including both the reflector with an increased lateral thickness and the structure of the protrusions and the indentations had the highest strength increase ratio.

Third Experimental Example

In a third experimental example, strength of the light emitting device depending upon the degree of chamfer of the chamfered portions of the first lead and the second lead was measured. Strength of the light emitting device was measured using a push-pull gauge system. As shown in FIG. 8, load was applied to points A and B. Tables 3 and 4 show measurement results of strength depending upon the width of the cavity and the degree of chamfer of the chamfered portions.

TABLE 3

|  | W1 = 4.6 | | W1 = 4.2 | | W1 = 4.0 | |
|---|---|---|---|---|---|---|
|  | Point A | Strength increase ratio (%) | Point A | Strength increase ratio (%) | Point A | Strength increase ratio (%) |
| R = 0.26 mm | 0.744 | 100% | 1.088 | 100% | 1.252 | 100% |
| R = 0.66 mm | 0.977 | 131.3% | 1.369 | 125.8% | 1.742 | 139.1% |
| R = 1.06 mm | 1.051 | 141.3% | 1.558 | 143.2% | 1.823 | 145.6% |

TABLE 4

| | W1 = 4.6 | | W1 = 4.2 | | W1 = 4.0 | |
|---|---|---|---|---|---|---|
| | Point B | Strength increase ratio (%) | Point B | Strength increase ratio (%) | Point B | Strength increase ratio (%) |
| R = 0.26 mm | 0.388 | 100.0% | 0.600 | 100.0% | 0.780 | 100.0% |
| R = 0.66 mm | 0.546 | 140.7% | 0.765 | 127.5% | 0.878 | 112.6% |
| R = 1.06 mm | 0.584 | 150.5% | 0.848 | 141.3% | 1.038 | 133.1% |

According to the third experimental example, it can be seen that, in the structure wherein the leads include the chamfered portions, strength was increased both in a central portion and an outer peripheral portion of the separation region between the leads.

It should be understood that the present disclosure is not limited to the above exemplary embodiments and experimental examples, and that that various modifications and changes can be made to the present invention without departing from the spirit and scope of the present disclosure, as defined by the appended claims and equivalents thereof.

What is claimed is:

1. A light emitting device, comprising:
    a first lead comprising:
        a first top lead; and
        a first bottom lead;
    a second lead spaced apart from the first lead by a separation space, the second lead comprising:
        a second top lead; and
        a second bottom lead;
    a base surrounding a part of side surfaces of the first and second leads, the base filling the separation space;
    a reflector disposed along an outer periphery of a lower region of the light emitting device;
    a cavity formed in a region surrounded by the reflector such that the first lead, the second lead, and the base are partially exposed by a lower surface of the cavity; and
    a light emitting diode disposed on at least one of the first and second leads,
    wherein:
        an area of the first top lead is greater than an area of the first bottom lead;
        an area of the second top lead is greater than an area of the second bottom lead;
        the first top lead comprises a protrusion formed on a side surface of the first top lead, the side surface of the first top lead facing a side surface of the second top lead;
        the second top lead comprises an indentation disposed in a region of the second top lead, the indentation corresponding to the protrusion; and
        in a view perpendicular to the lower surface of the cavity, the separation space forms a rotated L-shape between the protrusion and the indentation.

2. The light emitting device according to claim 1, wherein the first top lead and the first bottom lead are integrally formed with each other.

3. The light emitting device according to claim 1, wherein the second top lead and the second bottom lead are integrally formed with each other.

4. The light emitting device according to claim 1, wherein a first separation region of the separation space between the first top lead and the second top lead has a different shape than a second separation region of the separation space between the first bottom lead and second bottom lead.

5. The light emitting device according to claim 4, wherein:
    the first separation region of the separation space forms the rotated L-shape; and
    in the view perpendicular to the lower surface of the cavity, the second separation region of the separation space forms a triangular shape between the protrusion and the indentation.

6. The light emitting device of claim 5, wherein, in the view perpendicular to the lower surface of the cavity, the second separation region overlaps with the first separation region.

7. The light emitting device according to claim 1, wherein each of the first lead and the second lead comprises at least one fine protrusion formed on at least one side surface other than the side surfaces of the first lead and the second lead that face one another.

8. The light emitting device according to claim 7, wherein the base fills a space between the at least one fine protrusion of the first lead and the at least one fine protrusion of the second lead.

9. The light emitting device according to claim 7, wherein:
    the at least one fine protrusion of the first lead protrudes from the first top lead; and
    the at least one fine protrusion of the second lead protrudes from the second top lead.

10. The light emitting device according to claim 7, wherein the fine protrusions are exposed through at least one side surface of the base.

11. The light emitting device according to claim 1, wherein upper and lower surfaces of the first lead and the second lead are exposed.

12. The light emitting device according to claim 11, wherein an upper surface of the base is coplanar and flush with the upper surfaces of the first and second leads.

13. The light emitting device according to claim 11, wherein a lower surface of the base is coplanar and flush with the lower surfaces of the first and second leads.

14. The light emitting device according to claim 1, wherein a ratio of an overall width of a cross-section of the light emitting device to a width of an upper portion of the cavity is greater than or equal to 0.8 and less than 0.92.

15. The light emitting device according to claim 1, wherein the reflector and the base are integrally formed with one another.

16. The light emitting device according to claim 1, wherein the light emitting diode is disposed on at least one of the first lead and second lead.

17. The light emitting device according to claim 1, wherein the light emitting diode is a lateral type light emitting diode, a vertical type light emitting diode, or a flip-chip type light emitting diode.

18. The light emitting device of claim 1, wherein:
    the first top lead comprises an indentation formed on another side surface of the first top lead, the another side surface of the first top lead facing another side surface of the second top lead;
    the second top lead comprises a protrusion disposed in a region of the second top lead, the protrusion of the second top lead corresponding to the indentation of the first top lead; and
    in the view perpendicular to the lower surface of the cavity, the separation space forms another rotated L-shape between the protrusion of the second top lead and the indentation of the first top lead.

19. The light emitting device of claim 18, wherein the another rotated "L" shape is rotated differently than the rotated L-shape.

20. The light emitting device of claim 1, wherein the separation space only comprises two bends between the protrusion and the indentation.

* * * * *